(12) United States Patent
Dawson et al.

(10) Patent No.: US 9,008,844 B2
(45) Date of Patent: Apr. 14, 2015

(54) SYSTEM AND METHOD TO ROUTE AIRFLOW USING DYNAMICALLY CHANGING DUCTS

(75) Inventors: Christopher J. Dawson, Arlington, VA (US); Vincenzo V. Diluoffo, Sandy Hook, CT (US); Rick A. Hamilton, II, Charlottesville, VA (US); Michael D. Kendzierski, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 1709 days.

(21) Appl. No.: 12/135,239

(22) Filed: Jun. 9, 2008

(65) Prior Publication Data

US 2009/0302124 A1 Dec. 10, 2009

(51) Int. Cl.
G05B 13/00 (2006.01)
F24F 7/10 (2006.01)
F24F 11/00 (2006.01)
H05K 7/20 (2006.01)

(52) U.S. Cl.
CPC .............. *F24F 7/10* (2013.01); *F24F 11/0001* (2013.01); *H05K 7/20836* (2013.01)

(58) Field of Classification Search
USPC ........... 700/276, 277; 165/205, 207; 236/1 B, 236/1 C, 49.3
See application file for complete search history.

(56) References Cited

U.S. PATENT DOCUMENTS

| | | | |
|---|---|---|---|
| 2,751,198 A | 6/1956 | Rapp | |
| 3,516,347 A | 6/1970 | May | |
| 3,690,243 A | 9/1972 | Lambert | |
| 3,757,666 A | 9/1973 | Lambert | |
| 3,835,606 A | 9/1974 | Liberman | |
| 3,986,850 A | 10/1976 | Wilcox | |
| 4,646,500 A | 3/1987 | Smith | |
| 4,783,943 A | 11/1988 | Ljungkvist | |
| 4,996,810 A | 3/1991 | Forde | |
| 5,107,687 A | 4/1992 | Candeloro | |
| 5,167,575 A | 12/1992 | MacDonald | |
| 5,263,289 A | 11/1993 | Boyd | |
| 5,467,607 A | 11/1995 | Harvey | |
| 5,992,108 A | 11/1999 | Falcey | |
| 6,033,301 A | 3/2000 | Suwa | |
| 6,557,624 B1 | 5/2003 | Stahl et al. | |
| 6,604,993 B1 | 8/2003 | Boniface | |
| 6,862,179 B2 * | 3/2005 | Beitelmal et al. ........ | 361/679.53 |
| 6,885,115 B2 | 4/2005 | Hatori et al. | |
| 6,964,174 B2 * | 11/2005 | Shah .............................. | 62/129 |
| 6,991,533 B2 | 1/2006 | Tsai et al. | |

(Continued)

OTHER PUBLICATIONS http://www.tateaccessfloors.com/documentation_green.htm; pp. 1-2.

(Continued)

*Primary Examiner* — Robert Fennema
*Assistant Examiner* — Sivalingam Sivanesan
(74) *Attorney, Agent, or Firm* — John Pivnichny; Roberts, Mlotkowski, Safran & Cole, P.C.

(57) ABSTRACT

The invention generally relates to ventilation systems and methods, and more particularly to selectively configurable climate control systems and methods for use in data centers and the like. A method includes receiving or obtaining input data, generating at least one actuation signal to change a flow configuration of a re-configurable duct system based upon the input data, and transmitting the at least one actuation signal.

23 Claims, 15 Drawing Sheets

(56) References Cited

U.S. PATENT DOCUMENTS

| | | | |
|---|---|---|---|
| 7,188,779 B2 * | 3/2007 | Alles | 236/1 B |
| 7,214,131 B2 | 5/2007 | Malone | |
| 7,259,963 B2 | 8/2007 | Germagian et al. | |
| 7,266,964 B2 | 9/2007 | Vogel et al. | |
| 7,304,477 B2 | 12/2007 | Konijn et al. | |
| 2003/0224717 A1 | 12/2003 | Tsai et al. | |
| 2005/0159099 A1 | 7/2005 | Malone | |
| 2006/0015712 A1 | 1/2006 | Ang et al. | |
| 2006/0015866 A1 | 1/2006 | Ang et al. | |
| 2006/0073783 A1 | 4/2006 | Tsai et al. | |
| 2006/0076425 A1 | 4/2006 | Demster | |
| 2006/0186213 A1 * | 8/2006 | Carey et al. | 236/1 B |
| 2006/0260338 A1 | 11/2006 | VanGilder et al. | |
| 2007/0062685 A1 | 3/2007 | Patel et al. | |
| 2007/0080689 A1 | 4/2007 | Konijn et al. | |
| 2007/0146994 A1 | 6/2007 | Germagian et al. | |
| 2007/0213000 A1 | 9/2007 | Day | |
| 2009/0130967 A1 * | 5/2009 | Hofler et al. | 454/83 |
| 2009/0314373 A1 * | 12/2009 | Rostek et al. | 138/103 |

OTHER PUBLICATIONS

Alex Frangos; "Raised-Floor Ventilation Gains Footing in Offices"; URL: http://www.realestatejournal.com/propertyreport/office/20030714-frangos.html; pp. 1-2.

Kevin Epstein, et al.; "Double Jeopardy in a 'Slow' Disaster Computing Data Center Challenges in a Pandemic World"; URL: http://www.scalent.com/html/company/News/drj_spring07.pdf?item=21900; Spring 2006; pp. 50-51.

Ron Anderson; Increased power and cooling requirements are creating intensified demand for data-center redesigns; URL: http://i.cmpnet.com/v3.businessinnovation.cmp.com/pdfs/nwca_datacenter_report.pdf; Aug. 2006; pp. 1-24.

"Data Center Cooling, Server Room Cooling & Rack Cooling Solutions"; URL: http://www.42u.com/42u-rack-cooling.htm; pp. 1-4.

"Flow Modeling Solutions for Data Centers"; URL: http://www.fluent.com/solutions/data_centers/index.htm; p. 1.

* cited by examiner

000
SYSTEM AND METHOD TO ROUTE AIRFLOW USING DYNAMICALLY CHANGING DUCTS

FIELD OF THE INVENTION

The invention generally relates to ventilation systems and methods, and more particularly to selectively configurable climate control systems and methods for use in data centers and the like.

BACKGROUND

A data center (or other physical space) beneficially has, where possible, an optimized heating and cooling infrastructure. Maintaining data centers at desired temperatures (e.g., set points) helps prevent computer hardware (e.g., IT infrastructure) from overheating and malfunctioning. To this end, many data centers are cooled to relatively low temperatures (e.g., 65° F.) to increase equipment reliability and useful life, and to avoid downtime for repair and/or replacement.

However, current climate control systems are largely inefficient. Data centers typically have hot spots where IT equipment operates. Conventional cooling systems cool the entire data center to a temperature well below the set point so that IT equipment operating in the hot spots does not exceed the set point. This increases operational costs and wastes energy.

More specifically, conventional climate control systems for data centers typically utilize static (i.e., fixed) ducts and vents/diffusers. Usually this is achieved through the use of multiple air conditioners, heaters, vents or blowers. In the current art, a centralized air conditioning or 'forced air' system requires the use of static conduits or ducts. These ducts are usually installed to blow hot or cold air from a centralized air conditioning or heating unit to specific areas of the building. One problem with this known solution is that these ducts cannot easily be changed or rerouted to accommodate changing conditions on a room. For example, ducts are usually embedded in the ceiling, walls, or floor, and therefore require time-consuming intervention to re-route.

Another problem with fixed systems is that they are highly inefficient. In data centers, the hot spots are routinely changing location depending on which IT equipment is running at any given time. For example, some IT infrastructure in a first area of the data center may run during the day, while other IT infrastructure at a different area of the datacenter operates at night. To accommodate such moving hot spot targets, existing systems resort to a sort of 'overkill' by cooling the entire volume of the data center to well below the set point, which increases operational costs. Moreover, with the increasing awareness and desire to operate in a green manner, such excessive use of energy is undesirable.

Distributed cooling systems represent an alternative or supplement to fixed-duct systems, in which individual local units (similar, for example, to a window air conditioning unit) are moved around within the data center depending on the localized cooling needs. However, these decentralized systems are expensive to manage and maintain. Moreover, there is a certain amount of time required to re-position local cooling units within a data center, such that decentralized systems cannot adapt quickly to changes in temperature of different areas in a room.

Accordingly, there exists a need in the art to overcome the deficiencies and limitations described hereinabove.

SUMMARY

In a first aspect of the invention, there is a method, comprising: receiving or obtaining input data; generating at least one actuation signal to change a flow configuration of a re-configurable duct system based upon the input data; and transmitting the at least one actuation signal.

In another aspect of the invention, there is a method, comprising: receiving or obtaining input data comprising at least one of: actual temperature distribution data of a room; predicted heat generation data in the room; duct system data; fluid source data; price data; and temperature threshold data; and re-configuring a duct system to provide targeted air delivery to a room based on the input data.

In another aspect of the invention, there is a method, comprising: receiving or obtaining first input data; configuring a dynamically changeable duct system to deliver air to a first area of a room based on the first input data; receiving or obtaining second input data; and re-configuring the dynamically changeable duct system to deliver air to a second area of the room based on the second input data.

In another aspect of the invention, there is a computing infrastructure comprising a controller structured and arranged to: receive or obtain first input data; configure a dynamically changeable duct system to deliver air to a first area of a room based on the first input data; receive or obtain second input data; and re-configure the dynamically changeable duct system to deliver air to a second area of the room based on the second input data.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to ventilation systems and methods, and more particularly to selectively configurable climate control systems and methods for use in data centers and the like. Embodiments of the invention comprise a system and method for controlling airflow using dynamic ducting. More specifically, implementations of the invention utilize plural input parameters as a basis for controlling a dynamically configurable duct system to deliver ventilation air to targeted areas of a room (e.g., data center). In this manner, implementations of the invention provide a highly efficient climate control system that is reconfigurable both quickly and inexpensively. Accordingly, embodiments of the invention may be used to implement a green data center that is economical to operate and reduces energy waste, while still maintaining computing infrastructure at desired operating temperatures.

Figure 1:
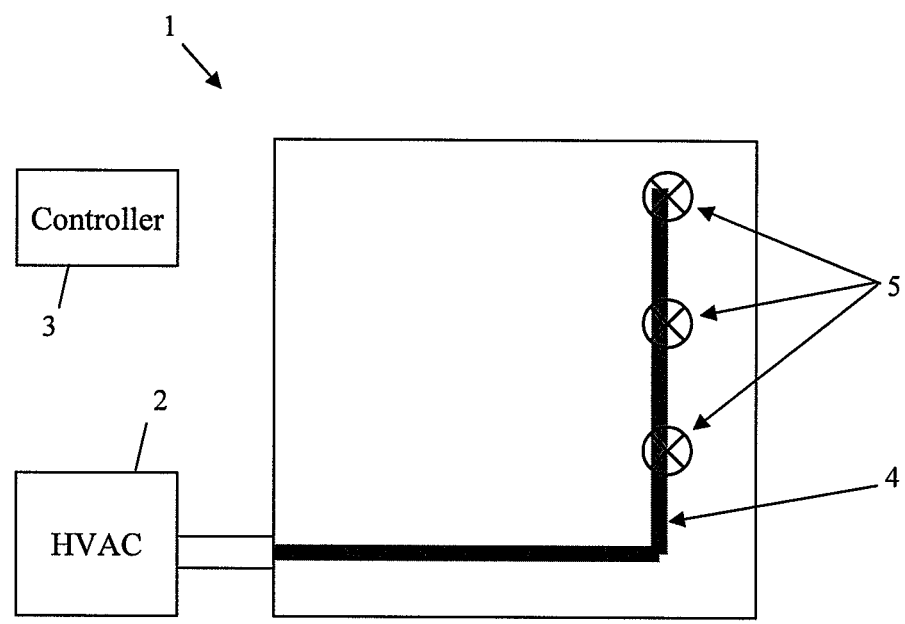
FIGS. 1 and 2 show diagrammatic representations of a duct system according to aspects of the invention.
Figure 2:
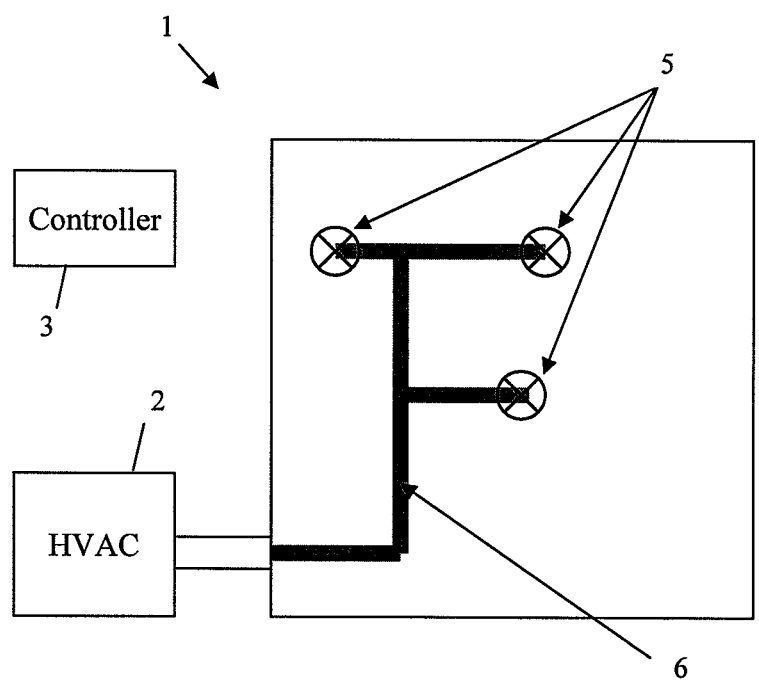

FIGS. 1 and 2 show diagrammatic depictions of a dynamically configurable duct system 1 according to aspects of the invention. In FIG. 1, the duct system 1 comprises a portion of a ceiling, floor, or wall of a room (e.g., data center). In embodiments, the duct system 1 is operatively connected to a fluid source 2 (e.g., HVAC unit, exhaust fan, blower, etc.) such that fluid (e.g., cooling air, heating air, ventilation air) from the source 2 may be conveyed within the duct system 1.

Still referring to FIG. 1, a controller 3 (such as, for example, a computing device described in greater detail below) is structured and arranged to control moving parts of the duct system 1 to create flow paths for the fluid within the duct system. For example, the controller 3 may send control signals to appropriate actuators within the duct system 1 to cause appropriate moving parts to move into positions to create a first duct 4 within the duct system 1. The first duct 4 defines a first flow path for fluid in the duct system 1. The configuration of the first duct 4 may be based upon various input parameters, including but not limited to: actual temperatures sensed in the room, predicted heat generation in the room, etc. Vents 5 comprised in the duct system 1 place the first duct 4 in fluid communication with the room. In this manner, the first duct 4 conveys fluid (e.g., cooling air) from the source 2 to specific areas of the room (e.g., hot spots that require cooling).

FIG. 2 shows the duct system in a second mode of operation, in which the ventilation requirements of the room have changed from that of FIG. 1. More specifically, in FIG. 2 the controller 3 has caused appropriate moving parts of the duct system 1 to move into positions to create a second duct 6, which defines a second flow path for fluid in the duct system 1. The configuration of the second duct 6 may be based upon, for example, actual temperatures sensed in the room and/or predicted heat generation in the room that may have changed from those used in FIG. 1. For example, IT machinery that was running and generating heat in a first portion of the room (e.g., FIG. 1) may have shut down, while different IT machinery in a second portion of the room (e.g., FIG. 2) may have turned on and begun generating heat. Vents 5 comprised in the duct system 1 place the second duct 6 in fluid communication with the room. In this manner, the second duct 6 conveys fluid (e.g., cooling air) from the source 2 to areas of the room (e.g., hot spots that require cooling) different from the areas shown in FIG. 1.

Exemplary Dynamic Duct Systems

Figure 3:
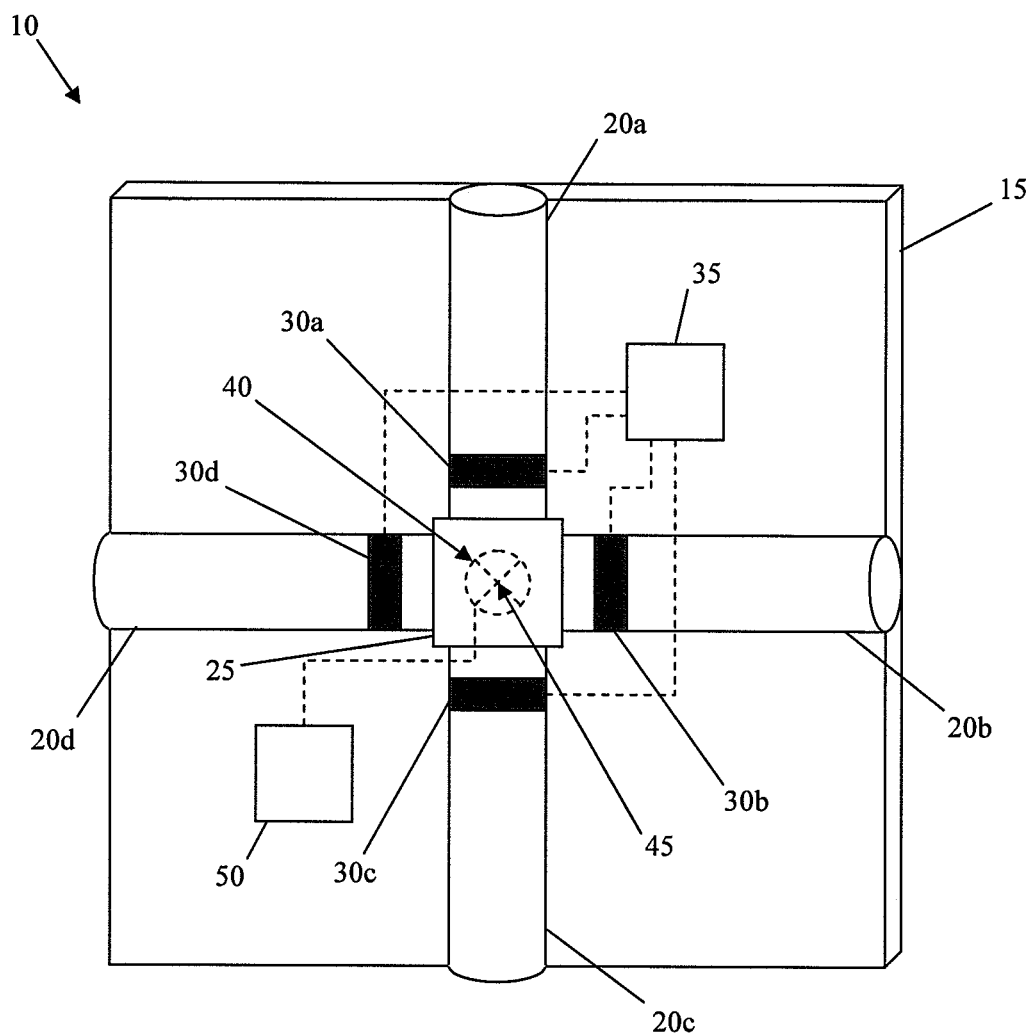
FIGS. 3-9 show details of exemplary duct systems that may be used with embodiments of the invention.

FIGS. 3-9 shows details of exemplary duct systems that may be used with implementations of the invention. For example, FIGS. 3-6 show details of a first exemplary dynamic duct system. Particularly, FIG. 3 shows an exemplary structural element 10 that can be used as an element of a duct system (e.g., duct system 1 shown in FIGS. 1 and 2) according to aspects of the invention. Throughout this disclosure, the structural element 10 is referred to as a tile (e.g., tile 10); however, the invention is not limited in this regard, and the structural element may comprise any suitable element. Tile 10 comprises a support element 15, which may comprise, for example, a plate-like element of suitable size and shape. For example, the support element 15 may comprise a rectangular tile that is sized and shaped like a conventional ceiling tile, and composed of any conventional material (e.g., plasterboard, fiberglass, plywood, metal, plastic, compressed fiberboard, etc.).

Attached to the support element 15 is a plurality of ducts 20a, 20b, 20c, 20d. Although four ducts 20a-d are depicted, any number of ducts (generally referred to using reference number 20) may be used within the scope of the invention. The ducts 20a-d are structured and arranged to convey fluid (such as for example, cool air, hot air, etc.) and can be any desired size, shape, and material (e.g., plastic, aluminum, etc.). In implementations, the ducts 20a-d are insulated to reduce heat transfer through the duct walls. In further embodiments, a second support element (not shown) may be connected to the ducts 20a-d on a side of the ducts 20a-d generally opposite the support element 15, whereby the ducts 20a-d are sandwiched between the support element 15 and the second support element.

In embodiments, the ducts 20a-d are connected to one another via manifold 25. The manifold 25 may be any size and shape, and composed of any suitable material, as long as it is capable of putting all ducts 20a-d in fluid communication with each other. For example, if the tile 10 comprises four cylindrical (e.g., pipe, tube, etc.) ducts 20a-d, the manifold 25 may comprise a cube-like structure having four holes in different faces such that an end of each respective duct fits into or around one of the holes. The manifold may be connected to the support member 15 at any location on the support member 15, and is not limited to the central location depicted in FIG. 3.

Associated with each one of the ducts 20a-d is a respective valve 30a-d. The valves 30a-d may be located at any suitable location along the respective ducts 20a-d, including outside the manifold 25, inside the manifold 25, or at an interface of the duct and the manifold 25. The valves 30a-d can be any device capable of selectively allowing (e.g., in an open state) or substantially prohibiting (e.g., in a closed state) the flow of fluid within an associated duct 20a-d. For example, each one of the valves 30a-d may be, but is not limited to, a gate valve, butterfly valve, or iris valve.

According to aspects of the invention, at least one actuator 35 is operatively connected to the plurality of valves 30a-d in a manner such that each valve 30a-d may be individually controlled (e.g., opened or closed). The actuator 35 may comprise any suitable actuator (e.g., an electric servo motor) that is connected to the valves 30a-d by suitable structure (e.g., linkage, cam, etc.) for effectuating opening/closing of the valves. In particular embodiments, a single actuator 35 is used to control all of the valves 30a-d, such as, for example, via an arrangement of cams on a rotatable shaft where each respective cam is linked to one of the valves 30a-d. In alternative embodiments, plural actuators 35 are used, such as, for example, one per valve. The at least one actuator 35 may be mounted at any desired location, such as, for example, on the support member 15, on or in the manifold 25, or on or in any of the ducts 20a-d.

Figure 4:
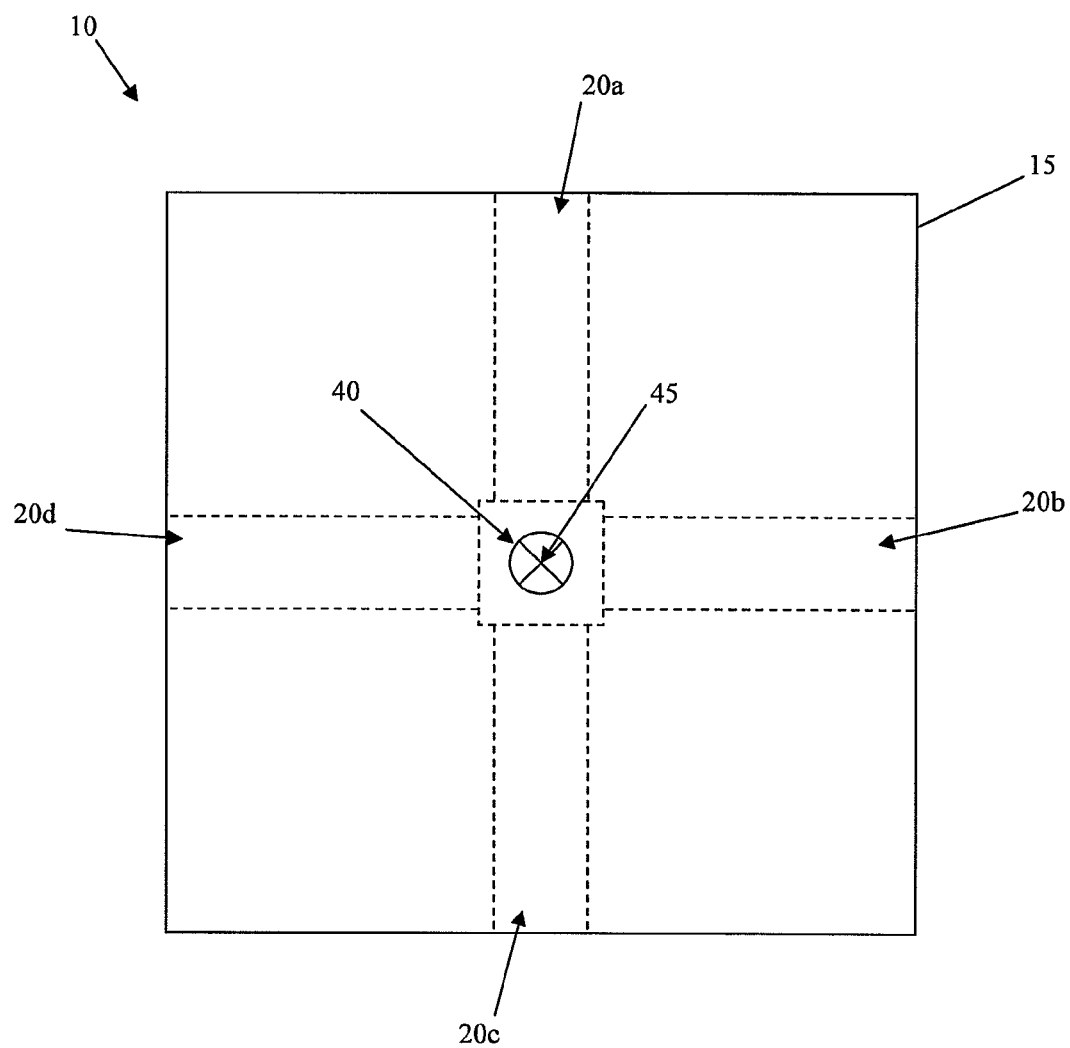

As seen in FIGS. 3 and 4, in embodiments, the tile 10 further comprises a port 40 extending through the support member 15 and including a port valve 45, such that the interior of the manifold 25 can be selectively placed in fluid communication with the opposite side of the support member 15. The port 40 may comprise a vent 5 as described above with respect to FIGS. 1 and 2. Port valve actuator 50 controls opening and closing of the port valve 45, and may comprise, e.g., an electric servo motor. The port valve actuator 50 may be located on the top side of the support member 15, e.g., attached to at least one of the support member 15, the manifold 25, and a duct 20a-d.

In particular embodiments, the port valve 45 comprises an adjustable shower-head type nozzle that can be changed between off, stream, and spray states, although the invention is not limited to such a valve and any suitable valve may be used. By utilizing a shower-head type nozzle, the fluid provided by the tile 10 into the room (e.g., data center) can be directed as a focused stream or a diffuse spray.

Figure 5:
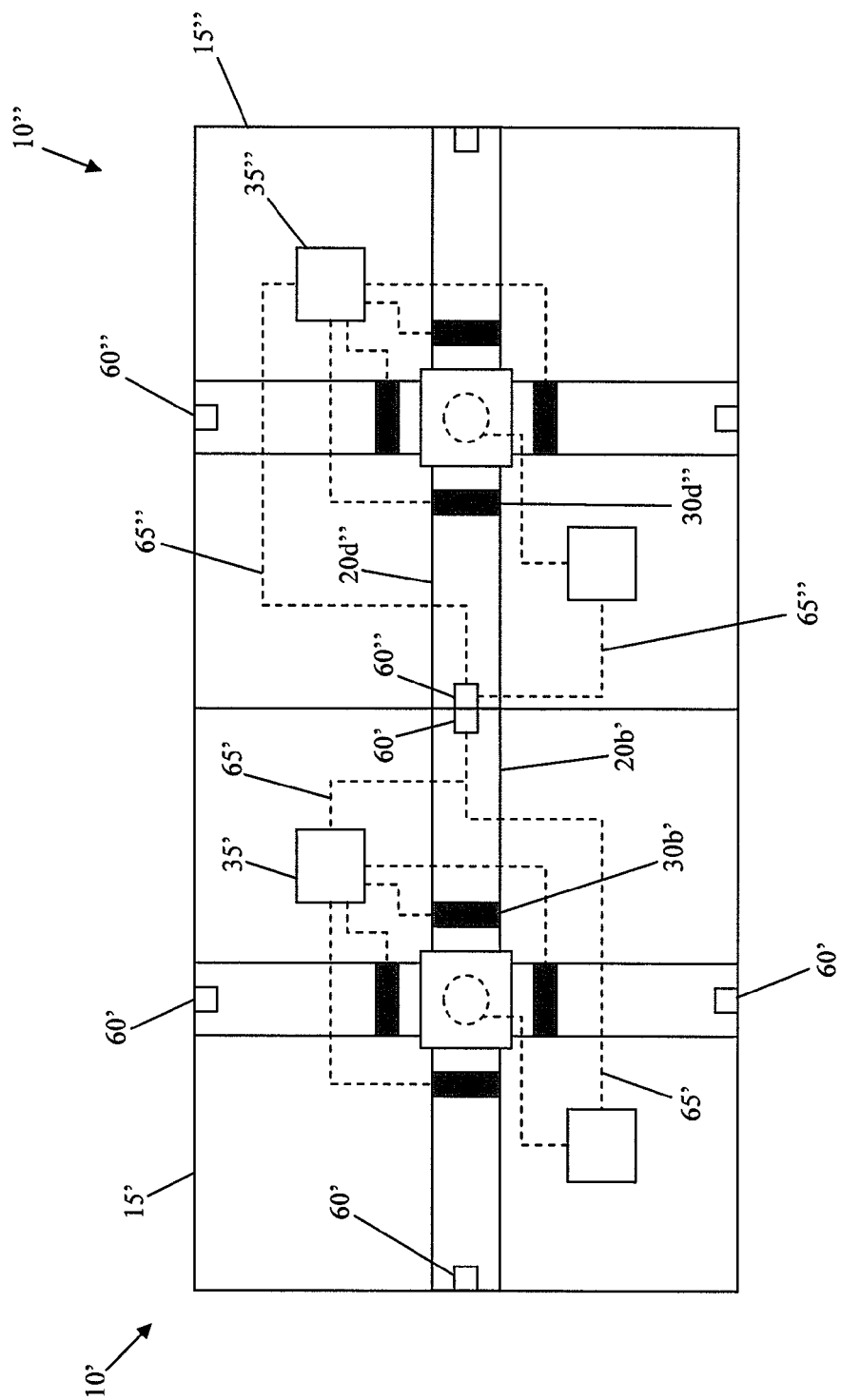

FIG. 5 shows an exemplary connection of two tiles 10' and 10" according to aspects of the invention. The tiles 10' and 10" are similar to those described above with respect to FIGS. 3 and 4, however, for clarity, not all features are labeled and/or shown in FIG. 5. Tile 10' is shown with support member 15', duct 20b', valve 30b', and actuator 35', while tile 10" is shown with support member 15", duct 20d", valve 30d", and actuator 35".

The ducts 20b' and 20d" are connected end to end such that they are in fluid communication with each other. The connection between ducts 20b' and 20d" may be made in any suitable manner, including, but not limited to: male to female (e.g., a smaller duct extends inside a larger duct), inner sleeve, outer sleeve, flange to flange, etc.

Still referring to FIG. 5, in embodiments, each tile 10' and 10" includes at least one electrical connection 60' (e.g., on tile 10') and 60" (e.g., on tile 10"). The electrical connectors 60' and 60" provide electrical communication between the tiles 10' and 10", with conductive wires 65' and 65" extending between the respective connectors 60' and 60" and actuators 35' and 35" (and port valve actuators 50, if present). In this manner, electricity for powering the actuators 35' and 35" (and, possibly, control signals for controlling the actuators 35' and 35") is provided to each tile 10' and 10".

According to aspects of the invention, the connectors 60' and 60" are located anywhere on the respective tiles 10' and 10", such as, for example: on the exterior of the ducts 20b' and 20d", on the interior of the ducts 20b' and 20d", or on the support members 15' and 15". In particular embodiments, the connectors 60' and 60" are arranged (e.g., at the edges of tiles 10) such that the connectors 60' and 60" are engaged substantially automatically and simultaneously when the ducts 20b' and 20d" are placed in end to end contact. However, the invention is not limited to this embodiment, and alternatively the connectors 60' and 60" may be provided with enough free play (e.g., via length of wires 65' and 65") such that they can be manually connected after the ducts 20b' and 20d" are engaged. The connectors 60' and 60" may comprise any suitable electrical connection device, such as, for example, male and female plugs, wiring harnesses, etc.

Moreover, in embodiments, each duct 20a-d of each tile 10 has an electrical connector 60 and wire(s) 65 associated therewith. In this manner, electrical redundancy is provided when a plurality of tiles 10 are connected in an array.

Figure 6:
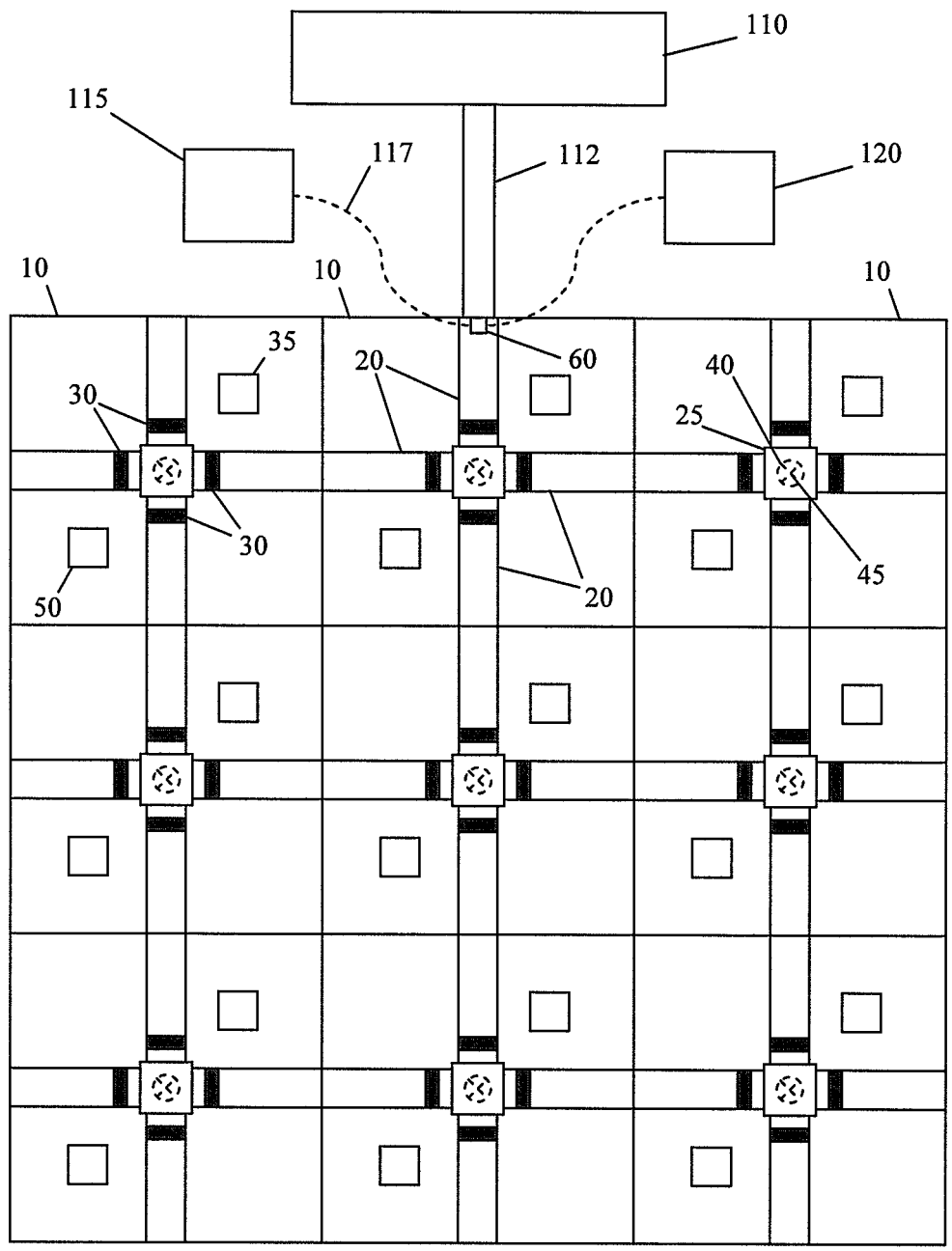

FIG. 6 shows an array of tiles 10 according to aspects of the invention. The tiles 10 may be similar to those already described thusfar, whereby the ducts and valves are generally referred to using reference numbers 20 and 30, respectively. The array of tiles includes an array of ports 40 and port valves 45 for moving fluid to/from an adjacent space (e.g., data center). The ducts 20 of adjacent tiles 10 are connected in fluid communication (e.g., similar to described above with respect to FIG. 5). Moreover, adjacent tiles 10 are electrically connected to each other as described above with respect to FIG. 5.

At least one duct 20 of one tile 10 is connected to (e.g., in fluid communication with) a fluid source (e.g., fluid source 2 as shown in FIGS. 1 and 2). The fluid source 110 may be connected to the duct 20 by any suitable plumbing 112 (e.g., ducting). Moreover, at least one tile 10 is electrically connected to a power supply 115 (e.g., an AC or DC power supply), via wire(s) 117 connected to an electrical connector 60 of at least one tile. In this manner, through selective control of the various actuators 35 and port valve actuators 50 of each tile 10, the valves 30 of each duct 20 of each tile 10 may be individually controlled to route fluid (e.g., air) from the fluid source 110 to any combination of tiles 10. The control may be provided, for example, by a controller 120 (such as, for example, controller 3 shown in FIGS. 1 and 2) that transmits control signals to the actuators 35 and port valve actuators 50, e.g., through wires 65 (e.g., via electrical connectors 60), or via wireless communication.

For example, the controller 120 may send signals to appropriate ones of the actuators 35 to cause a selective opening or closing of appropriate valves 30. In this manner, the fluid from the fluid source 110 is routed along the flow path defined by selected ones of the ducts 20 and valves 30. In addition to controlling the routing of the fluid amongst the tiles 10, the controller 120 may also be arranged to control the opening and closing of the various port valves 45 in the tiles 10. For example, the controller 120 may send actuation signals to appropriate ones of the port valve actuators 50 of tiles located along the flow path defined by the ducts 20 and valves 30. In this manner, the controller 120 can cause fluid from fluid supply 110 to be delivered in a targeted manner to the areas of the room.

The controller 120 described above may be any suitable control device, such as a computing device, that is capable of transmitting actuation signals to each one of the respective actuators 35 and/or port valve actuators 50 in an array of tiles 10. In embodiments, each respective actuator 35 and port valve actuator 50 of an array of tiles 10 may be assigned a unique identifier (ID), such that individual control of each actuator 35 and port valve actuator 50 is possible. More specifically, each actuator 35 and port valve actuator 50 may be: provided with a predefined ID (e.g., similar to a MAC address); assigned an ID (e.g., similar to a static IP address) by a user via programming of the controller 120; or, automatically assigned an ID by the controller (e.g., similar to a plug-and-play dynamic IP address) by way of programming of the controller 120. By having a unique ID associated with each actuator 35 and port valve actuator 50, the controller 120 can be programmed to send appropriate actuation signals to each individual actuator 35 and port valve actuator 50 (via electrical connectors 60 and wires 65, or wirelessly) to achieve substantially any desired flow configuration of an array of tiles 10.

Figure 7:
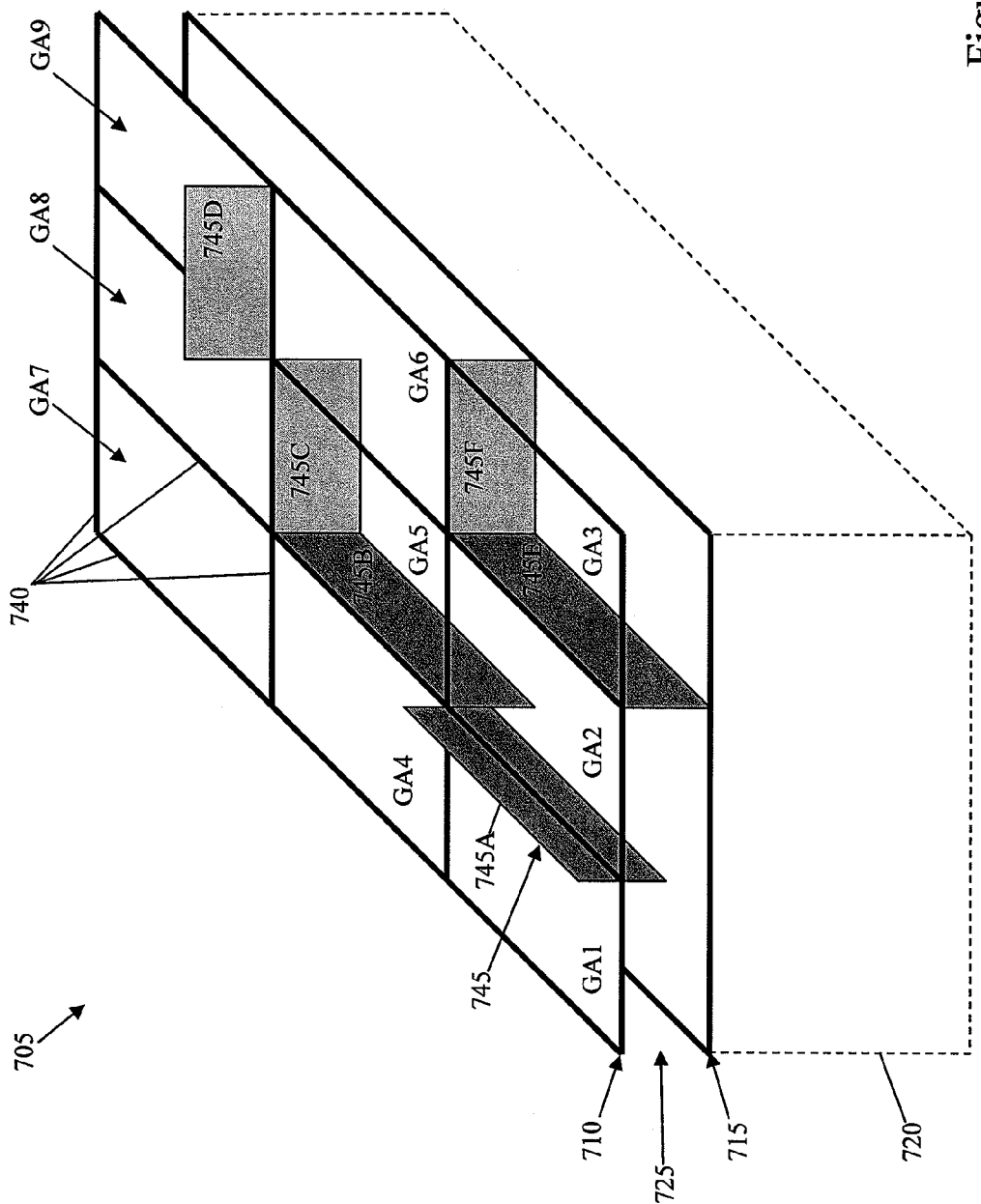
Figure 8:
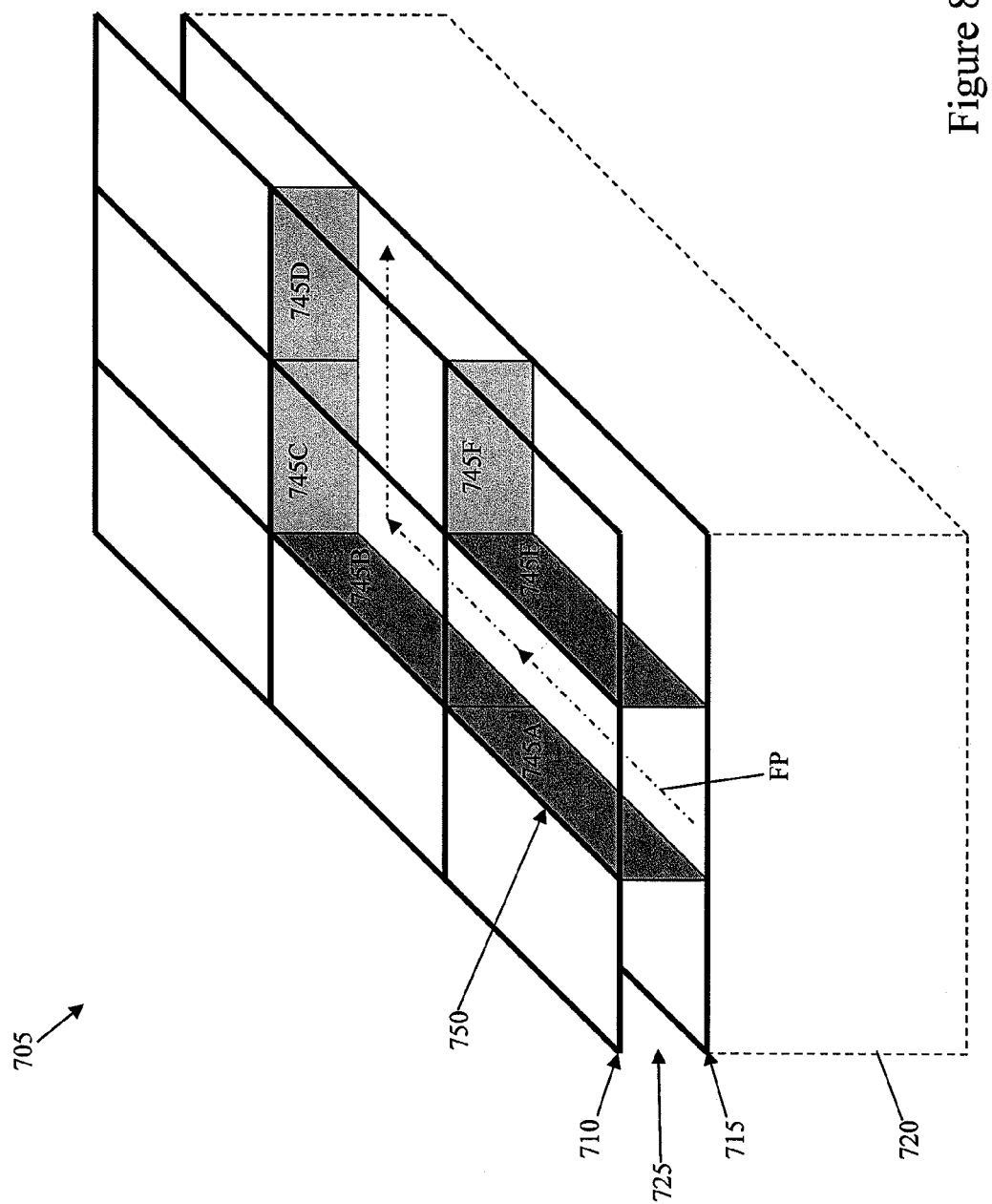
Figure 9:
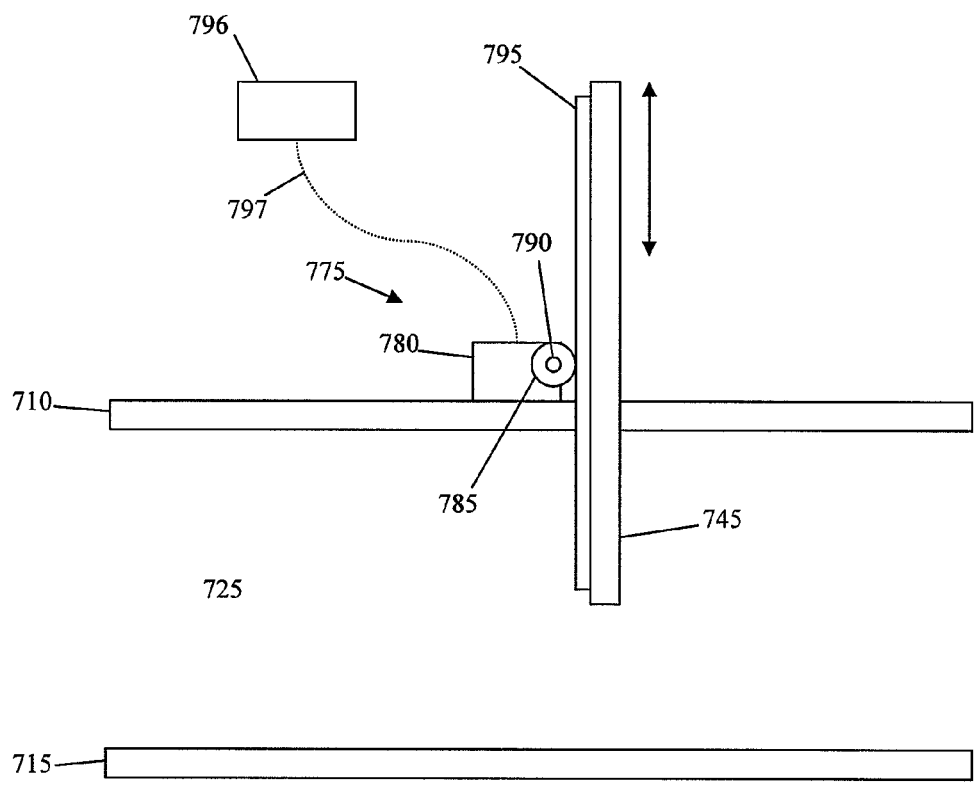

FIGS. 7-9 show details of second exemplary dynamic duct system that may be used with implementations of the invention. Particularly, FIG. 7 shows a perspective view of an exemplary dynamic duct system which may be used as duct system 1 shown in FIGS. 1 and 2. The system 705 includes an first structural element 710 and a second structural element 715. In embodiments, the first and second structural elements 710, 715 are substantially planar, although the invention is not limited to this configuration, and any suitable shapes can be used within the scope of the invention. The first and second structural elements 710, 715 may be composed of any suitable material (e.g., ceiling tiles, plasterboard, fiberglass, plywood, metal, plastic, compressed fiberboard, etc.).

In embodiments, the system 705 is arranged adjacent or near a room 720, which may comprise, for example, a data center, or any other type of area for which ventilation may be provided. In the embodiment depicted in FIG. 7, the system 705 is arranged above the room 720, such that the second structural element 715 constitutes a ceiling of the room 720. However, the invention is not limited to this configuration, and portions of the system can be arranged in any suitable spatial relation to the room 720, such as, for example, at the floor, at a wall, or at various combinations of at least one of the ceiling, floor, and walls.

The first and second structural elements 710, 715 are spaced apart from one another such that a space 725 is formed between them. The space 725 constitutes a volume in which dynamic ducting according to aspects of the invention may be arranged and re-arranged according to ventilation requirements of the room 720.

In embodiments, the first structural element 710 is divided into a grid as depicted in FIG. 7. In the exemplary embodiment shown in FIG. 7, the grid is a three-by-three grid having nine grid areas labeled GA1, GA2, . . . , GA9. The invention is not limited to this size grid, and any suitable grid can be defined in the first structural element 710. In embodiments, each grid area (e.g., GA7) has four rectilinear sides 740 defining its perimeter. Associated with each one of the sides 740 of each grid area GA1, GA2, . . . , GA9 is an extendable and retractable partition generally referred to with reference number 745. For clarity, only six partitions, specifically referred to with reference numbers 745A, 745B, . . . , 745F, are shown in FIG. 7 and described herein. However, the description of these representative six partitions 745A, 745B, . . . , 745F applies to all of the partitions 745 of the system 705. Adjacent grid areas (e.g., GA1 and GA2) may share a common partition (e.g., 745A) along common side 740, such that in the exemplary embodiment shown in FIG. 7, there are a total of twenty four partitions 745 (although only six partitions 745A, 745B, . . . , 745F are shown for clarity).

Each partition is selectively moveable between an extended position and a retracted position. In the extended position, the partition 745 extends into the space 725 between the first and second structural elements 710, 715, for example, as depicted by partitions 745B, 745C, 745E, and 745F in FIG. 7. In the retracted position, the partition 745 is arranged so that it does not extend between the first and second structural elements 710, 715, for example, as depicted by partition 745D in FIG. 7. In the specific example shown in FIG. 7, the partitions 745 move between the extended and retracted positions by translating vertically (e.g., perpendicular to the plane of first structural element 710). For example, partition 745A is shown between the extended and retracted positions.

According to aspects of the invention, by selectively controlling which partitions 745 are in the extended and retracted positions, a duct 750 can be dynamically created in the space 725, as depicted in FIG. 8. More specifically, by arranging partitions 745A-F in the extended position (e.g., extending between the first and second structural elements 710, 715), a duct 750 that defines a flow path FP can be provided. Although the first and second structural elements 710, 715 are shown as transparent, they are substantially solid members such that the combination of the first and second structural elements 710, 715 and the extended partitions 745A-F creates a rectangular duct 750 around flowpath FP. A different duct can be arranged in the space 725 by moving partitions 745A-F into the retracted position and moving other partitions into the extended position.

In embodiments of the invention, each partition 745 is associated with an actuator for moving the partition 745 between the retracted and extended position. FIG. 9 shows an exemplary arrangement for moving vertically moveable partitions (e.g., as shown in FIGS. 7 and 8), in which an actuator 775 comprises an electric servo motor 780 with a pinion gear 785 attached to a rotatable shaft 790. The pinion gear 785 may operatively engage a rack gear 795 affixed to the partition 745, such that rotation of the rotatable shaft 790 causes up or down movement of the partition 745. Alternatively, the vertical motion of the partition may be provided by a servo motor operatively connected to the partition by a scissor-lift linkage mechanism (not shown). In either case, the actuator (e.g., electric servo motor) may receive power from any suitable power source and may receive signals from controller 796 in any suitable manner (e.g., via electrical connection 797).

The controller 796 described above may be similar to controller 120 (described in FIGS. 3-6) in that controller 796 may be arranged to transmit actuation signals to respective actuators based on a respective unique identifier (ID). In this manner, the controller 796 may be used to provide coordinated control of all of the controllable (e.g., actuatable) parts of the dynamic duct system.

Processes of the Invention

Figure 10:
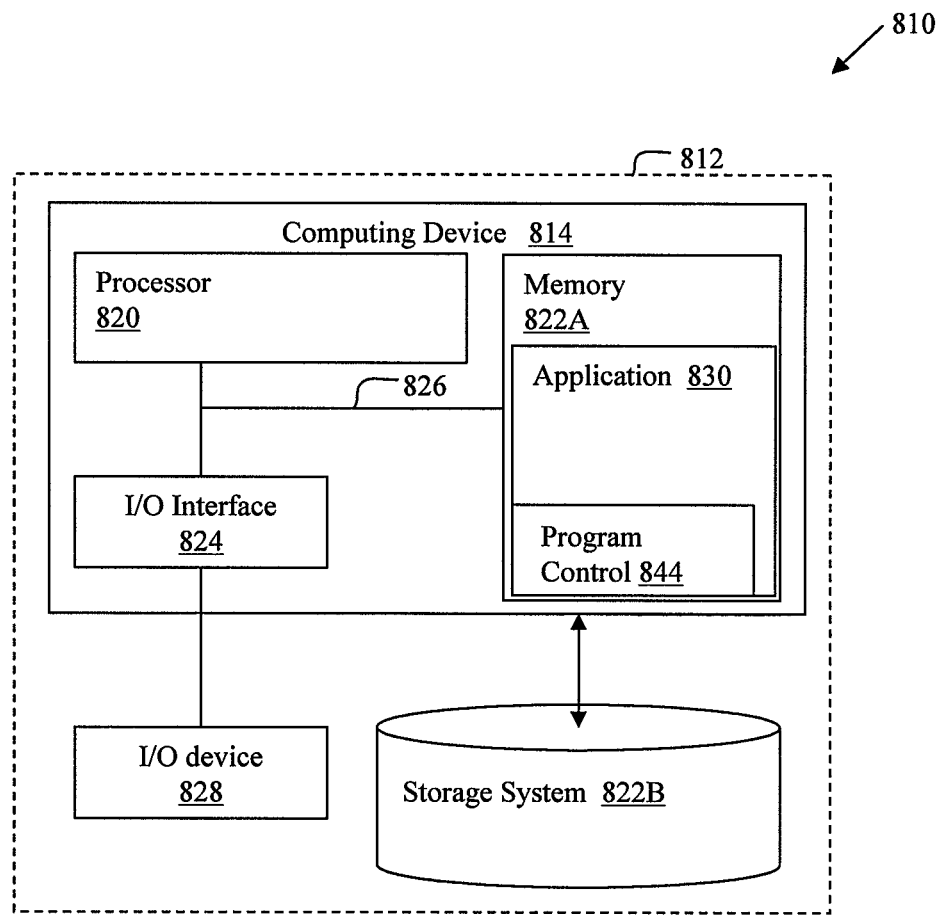
FIG. 10 shows an illustrative environment for implementing the steps in accordance with the invention.

FIG. 10 shows an illustrative environment 810 for managing processes in accordance with the invention. To this extent, the environment 810 includes a computer infrastructure 812 that can perform the processes described herein. For example, the controller 3, or controller 120, or controller 796 (described above) may comprise, or be comprised in, the computer infrastructure 812. In particular, the computer infrastructure 812 includes a computing device 814 that comprises an application 830 having a program control 844, which makes the computing device 814 operable to perform the processes described herein, such as, for example, providing control signals to create a dynamic duct with which to control temperature in a room sensed by sensors and/or according to a predefined cooling plan.

The computing device 814 includes a processor 820, a memory 822A, an input/output (I/O) interface 824, and a bus 826. The memory 822A can include local memory employed during actual execution of program code, bulk storage, and cache memories which provide temporary storage of at least some program code (e.g., program control 844) in order to reduce the number of times code must be retrieved from bulk storage during execution. Further, the computing device 814 is in communication with an external I/O device/resource 828 and a storage system 822B. The I/O device 828 can comprise any device that enables an individual to interact with the computing device 814 or any device that enables the computing device 814 to communicate with one or more other computing devices using any type of communications link. The external I/O device/resource 828 may be keyboards, displays, pointing devices, etc., which enable a user to adjustably control the climate in a room (e.g., data center) using a dynamic duct system.

The processor 820 executes computer program code (e.g., program control 844), which is stored in memory 822A and/or storage system 822B. While executing computer program code, the processor 820 can read and/or write data to/from memory 822A, storage system 822B, and/or I/O interface 824. The bus 826 provides a communications link between each of the components in the computing device 814.

The computing device 814 can comprise any general purpose computing article of manufacture capable of executing computer program code installed thereon (e.g., a personal computer, server, wireless notebook, smart phone, personal digital assistant, etc.). However, it is understood that the computing device 814 is only representative of various possible equivalent computing devices that may perform the processes described herein. To this extent, in embodiments, the functionality provided by the computing device 814 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 812 is only illustrative of various types of computer infrastructures for implementing the invention. For example, in embodiments, the computer infrastructure 812 comprises two or more computing devices (e.g., a server cluster) that communicate over any type of communications link, such as a network, a shared memory, or the like, to perform the processes described herein. Further, while performing the processes described herein, one or more computing devices in the computer infrastructure 812 can communicate with one or more other computing devices external to computer infrastructure 812 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

The steps of the flow diagram described herein may be implemented in the environment of FIGS. 1-10. The flow diagram may equally represent a high-level block diagram of the invention. The steps of the flow diagram may be implemented and executed from a server, in a client-server relationship, by computing devices in an ad hoc network, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environments of FIGS. 1-10. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Figure 11:
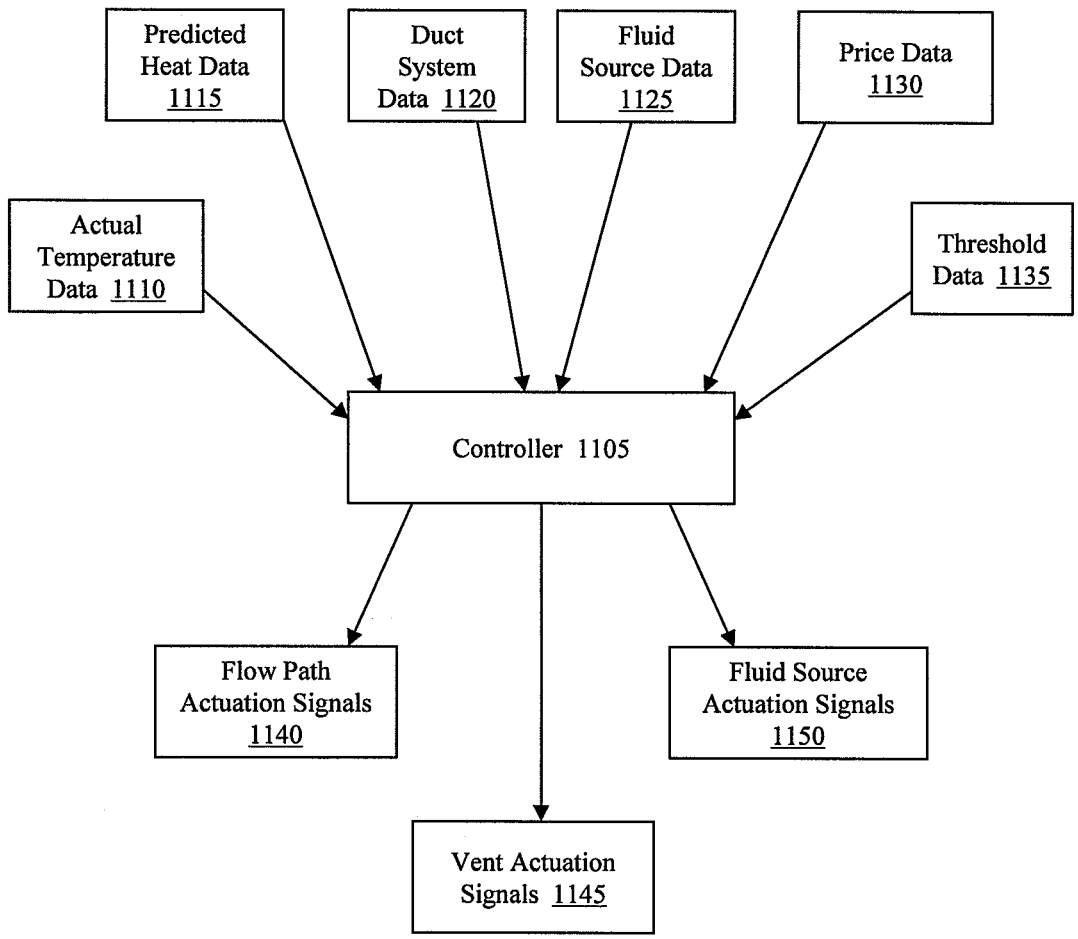
FIGS. 11-13 show flow diagrams depicting implementations of a method according to aspects of the invention.

FIG. 11 shows a high level block diagram depicting aspects of a system and method in accordance with aspects of the invention. As shown in FIG. 11, a controller 1105 receives or obtains various input data and generates control signals based upon the input data. The controller 1105 may comprise, for example, any of controllers 3, 120, 796 described above, and may take the form of computer infrastructure 812 (or of a sub-part of the computer infrastructure 812, such as the program control 844).

In embodiments, controller 1105 receives or obtains actual temperature data 1110, which may comprise sensed or detected temperatures in the room (e.g., data center). For example, thermostatic sensors may be located at various locations throughout the room, and calibrated electrical signals from these sensors may be communicated to the controller 1105 to provide the controller 1105 with data regarding the actual temperature at locations within the room. The temperature sensors may be located at any suitable locations, such as, for example, on ceilings, walls, floors, hanging from ceilings, on machine racks, or even within or comprised in computing machinery operating in the room. Locations of each sensor may be defined relative to a coordinate system (e.g., a coordinate system defined relative to the room) and saved in the controller 1105, such that in embodiments the actual temperature data 1110 provides a three dimensional mapping of temperature distribution within the room.

In further embodiments, the controller 1105 receives or obtains predicted heat generation data 1115, which may comprise, for example, estimated heat generation based upon scheduled operating of machinery within the room. More specifically, a spatial mapping of machinery location in the room (e.g., relative to the coordinate system described above with respect to the actual temperature data 1110) may be pre-determined and saved in the controller 1105 (or saved in a location accessible by the controller 1105). Moreover, the amount of heat nominally generated by each machine may be pre-determined and saved in, or accessible by, the controller 1105. Additionally, a pre-determined job scheduling program according to which all of the machines are operated at known times may be pre-determined and saved in, or accessible by, the controller 1105. By combining the location of each machine, when each machine will be on or off, and how much heat each machine nominally generates, the controller 1105 may be programmed to determine (e.g., calculate) how much heat will be generated at any location in the room at any time of day.

According to further aspects of the invention, the controller 1105 receives or obtains duct system data 1120, which may comprise, for example, data regarding the duct system (such as, for example, a duct system as described with respect to FIGS. 1-9). More specifically, the dimensions and location of the duct system (e.g., relative to the coordinate system described above) may be predetermined and saved in, or accessible by, the controller 1105. Also, an identification and mapping of each controllable part (e.g., assignment of unique ID, as described above) of the duct system may be determined and saved in, or accessible by, the controller 1105. Additionally, the current state of each controllable part of the duct system may be determined by the controller 1105 by memory (e.g., via the last actuation command given to each part), or reset (e.g., send a reset actuation command to all parts). In this manner, the controller 1105 obtains data regarding the current state of the duct system, e.g., what configuration of duct currently exists, which controllable valves are open or closed, etc.

According to additional aspects of the invention, the controller 1105 receives or obtains fluid source data 1125, which may comprise, for example, data regarding the characteristics of the HVAC system connected to the duct system. More specifically, the spatial location (e.g., relative to the coordinate system described above) and the operating characteristics (e.g., flow capacity, heating/cooling rate, etc.) of each fluid source may be pre-determined and saved in, or accessible by, the controller 1105. The spatial location may include, for example, where each fluid source is connected to the duct system, the length of static plumbing between the fluid source and the duct system, etc. Moreover, the current operating state of each fluid source may be determined by the controller 1105, for example, by appropriate electrical signals indicative of operating state (e.g., on or off, fan speed, etc.) being transmitted from each fluid source to the controller 1105.

In even further embodiments, the controller 1105 receives or obtains price data 1130, which may comprise, for example, data regarding the price to change the temperature distribution of the room from its current state to a different state. More specifically, the cost per unit of electricity may be pre-determined and saved in, or accessible by, the controller 1105.

Moreover, the amount of electricity used by each fluid source at any particular operating load may be pre-determined and saved in, or accessible by, the controller 1105. Accordingly, the controller 1105 may be programmed to determine (e.g., calculate) a price to effect a specific temperature change in the room based upon: the electricity cost data; the electricity usage data; the actual temperature data 1110; the predicted heat generation data 1115; the duct system data 1120; and the fluid source data 1125.

In additional aspects of the invention, the controller 1105 receives or obtains threshold data 1135, which may comprise, for example, data regarding temperature thresholds for locations within the room. For example, pre-defined areas of the room may have a first pre-defined temperature threshold above which cooling may be provided if cost effective, and another pre-defined temperature threshold above which cooling must be provided regardless of price. Similar thresholds may be pre-defined for heating requirements (e.g., when area of the room are too cold). Any number of thresholds may be used for any number of areas of the room, and the thresholds may pre-determined and saved in, or accessible by, the controller 1105.

Still referring to FIG. 11, the controller 1105 generates control signals based upon at least one of the data 1110-1135. For example, the controller 1105 may be programmed to generate appropriate flow path actuation signals 1140 to create a duct in the duct system to achieve a desired temperature distribution in the room. The flow path actuation signals 1140 may comprise, for example, signals transmitted via wire and/or wirelessly to actuators (e.g., actuators 35 or 75 described above) to cause portions of the duct system to move to modify and/or create a particular duct configuration.

Optionally, in embodiments where controllable vents are used, the controller 1105 may be programmed to generate appropriate vent actuation signals 1145 to open, close, or adjust vents in the duct system to achieve a desired temperature distribution in the room. The vent actuation signals 1145 may comprise, for example, signals transmitted via wire and/or wirelessly to vent actuators (e.g., actuators 50 described above) to cause appropriate one of the vents to open, close, or adjust.

Optionally, in embodiments where controllable fluid source(s) are used, the controller may be programmed to generate appropriate fluid source actuation signals 1150 to turn an HVAC unit on or off, adjust an HVAC unit fan speed, etc., to achieve a desired temperature distribution in the room. The fluid source actuation signals 1150 may comprise, for example, signals transmitted via wire and/or wirelessly to an HVAC unit to cause a desired operational state of the HVAC unit.

Although specific inputs (e.g., 1110-1135) have been described above, the invention is not limited to these inputs. Instead, the controller 1105 may be arranged to generate actuation signals (e.g., control signals) based upon any desired combination of input data. For example, in embodiments, the controller 1105 may be programmed to determine the most cost effective duct arrangement within the duct system for achieving a desired temperature effect in the room. For example, based upon the inputs (e.g., 1110-1135), there may be plural ways of configuring the duct system to achieve a desired temperature result in the room. Accordingly, in embodiments, the controller 1105 is programmed with a cost minimization function that, based upon the available input (e.g., 1110-1135), generates a lowest price configuration for the duct system. The appropriate actuation signals (e.g., 1140-1150) are then generated based upon the lowest price configuration.

In additional embodiments, the controller 1105 may be programmed to generate a duct configuration that minimizes physical change between the previous duct configuration and a new duct configuration. For example, based upon the inputs (e.g., 1110-1135), there may be plural ways of configuring the duct system to achieve a desired temperature result in the room. Accordingly, in embodiments, the controller 1105 is programmed with a change minimization function that, based upon the available input (e.g., 1110-1135), generates a least-change configuration for the duct system. The appropriate actuation signals (e.g., 1140-1150) are then generated based upon the least-change configuration. In this manner, energy is saved through efficient management of the duct system.

Other possible input parameters usable by the controller 1105 include, but are not limited to: amount of heat transfer (e.g., energy loss) of air traveling from the fluid source to the room; parameters that define when to pre-cool (or pre-heat) an area of a room based upon an upcoming IT job (e.g., pre-emptive temperature control); flow rate of air through the duct system (e.g., using double width ducts or plural paths to deliver more air to a location in the room); time elapsed from last duct system configuration change (e.g., to avoid or minimize too-frequent re-configuration of the duct system); and shortest path programming (e.g., to configure a duct that provides the shortest path between the fluid source and the targeted air delivery area).

Figure 12:
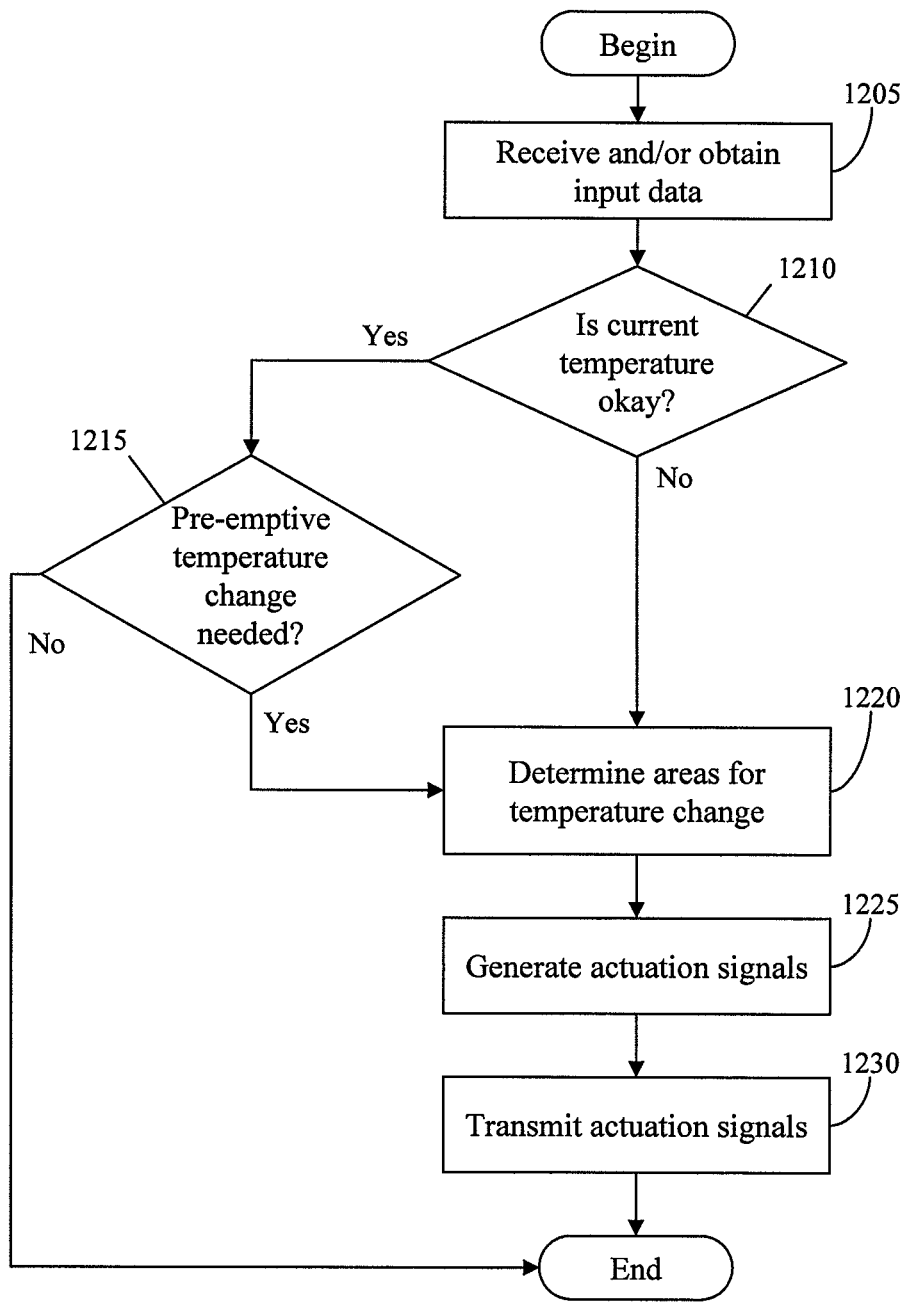

FIG. 12 shows a flow diagram depicting steps of a method for providing air to a room in accordance with aspects of the invention. At step 1205, a controller receives or obtains input data. In embodiments, the controller may include a CPU, memory, storage, etc., and may be, e.g., controller 1105 described above with respect to FIG. 11. The input data may be input data 1110-1135 described above with respect to FIG. 11. For example, the controller may receive data signals and/or retrieve data from storage, wherein the data is associated with at least one of: actual temperature data; predicted heat generation data; duct system data; fluid source data; price data; and threshold data.

At step 1210, the controller determines whether the current temperature(s) in the room (or areas of the room) are acceptable. This may be accomplished, for example, by comparing actual temperature data to thresholds. If the determination at step 1210 is positive, then at step 1215 the controller determines, based upon predicted heat generation data, actual temperature data, and threshold data, whether a pre-emptive temperature change is needed. If the determination at step 1215 is negative, then no changes are required and the process ends (or returns to step 1205 for a subsequent iteration).

If the determination at step 1215 is positive (e.g., a pre-emptive change is needed), or if the determination at step 1210 is negative (e.g., the current temperature is not acceptable), then at step 1220 the controller determines which areas of the room need a temperature change and how much of a temperature change. This is accomplished by comparing threshold data to at least one of predicted heat generation data and actual temperature data.

At step 1225, the controller generates appropriate actuation signals, such as, for example, at least one of actuation signals 1140, 1145, and 1150 described above with respect to FIG. 11. For example, the controller may be programmed to generate at least one of: flow path actuation signals to modify an existing duct and/or create a new duct in the duct system; vent actuation signals to open, close, or adjust vents; and fluid source actuation signals to turn a fluid source on/off or to adjust fan speed. The generation of the actuation signals may be based upon the input data as well as other parameters, including but not limited to: a cost minimization function; a physical change minimization function; amount of heat transfer (e.g., loss) of air traveling from the fluid source to the room; parameters that define when to pre-cool (or pre-heat) an area of a room based upon an upcoming IT job (e.g., pre-emptive temperature control); flow rate of air through the duct system (e.g., using double width ducts or plural paths to deliver more air to a location in the room); time elapsed from last duct system configuration change (e.g., to avoid or minimize too-frequent re-configuration of the duct system); shortest path; etc.

At step 1230, the controller transmits the actuation signals to controllable components (e.g., actuators in the duct system, fluid source, etc.). In embodiments the actuation signals are communicated via electrical wire and/or wirelessly to actuators of the duct system. From step 1230, the process ends or returns to step 1205 for a subsequent iteration. In this manner, a dynamically configurable duct system can be controlled based upon various input parameters to provide targeted airflow to localized areas of a room.

Figure 13:
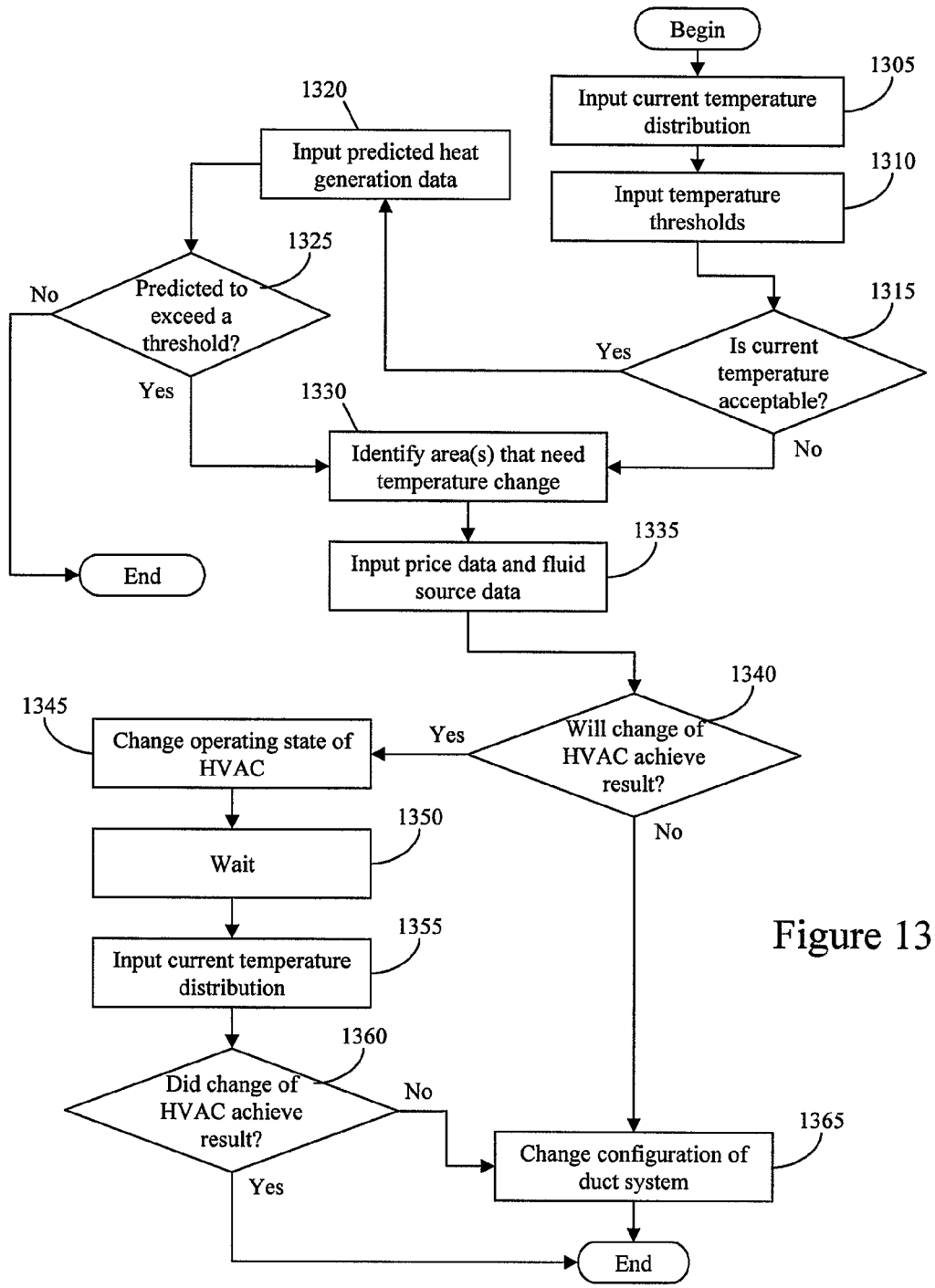

FIG. 13 shows a flow diagram depicting steps of a method for providing air to a room in accordance with further aspects of the invention. As depicted in FIG. 13, the different types of input data need not be gathered at the same time. Instead, in embodiments, required input data can be received or obtained by the controller on an as-needed basis. For example, at step 1305, the controller receives and/or obtains data associated with the current temperature distribution in the room, and at step 1310 the controller receives and or obtains threshold data. In embodiments, the controller is similar to controller 1105 described in FIG. 11, and the current temperature distribution data and threshold data are similar to data elements 1110 and 1135 described with respect to FIG. 11.

At step 1315, the controller determines whether the current temperature(s) in the room (or areas of the room) are acceptable, for example, by comparing the data of steps 1305 and 1310. If the determination at step 1315 is positive, then at step 1320 the controller obtains and/or receives upcoming job location data (which may be similar, for example, to predicted heat generation data 1115). At step 1325, the controller determines (e.g., predicts via calculation), based upon the data of steps 1305, 1310, and 1320, whether any upcoming jobs will create a temperature situation that exceeds a threshold. If the determination at step 1325 is negative, the process ends or returns to step 1305 for a subsequent iteration.

However, if the determination at step 1325 is positive (e.g., upcoming jobs are predicted to cause a threshold to be exceeded) or if the determination at step 1315 is negative (e.g., the current temperature distribution exceeds one or more thresholds), then at step 1330 the controller determines which area, or areas, of the room need a temperature change. Step 1330 may also include a determination of how much of a temperature change each area, or areas, of the room require. This may be performed, for example, by comparing the data from steps 1305, 1310, and 1320.

At step 1335, the controller receives or obtains data regarding price to operate the fluid source(s), which data may be similar to fluid source data 1125 and price data 1130. Step 1335 may also include a determination by the controller of how much it will cost to achieve the temperature changes from step 1330. This determination may be performed, for example, as described with respect to FIG. 11.

At step 1340, the controller determines whether changing operating state(s) of fluid source(s) will achieve the desired temperature change (e.g., from step 1330). In embodiments, changing the operating state of a fluid source may comprise, but is not limited to: turning an HVAC unit on or off, changing a fan speed of an HVAC unit, etc. In embodiments, the determination at step 1340 may accomplished, for example, by obtaining the current duct system configuration data (e.g., similar to duct system data 1120) and using this data with data from steps 1305, 1310, 1320, 1330, and 1335 to predict (e.g., calculate) whether changing the operating state of the fluid source will achieve the desired temperature change (e.g., from step 1330).

If the determination at step 1340 is positive, then at step 1345 the controller generates at least one actuation signal to cause at least one operating state of at least one fluid source to be changed. For example, the controller may generate a signal that causes a fluid source to increase its fan speed (thereby increasing airflow through the existing duct system configuration). Step 1345 includes transmitting the actuation signal to the appropriate fluid source (e.g., via wire or wirelessly).

In embodiments, after transmitting the actuation signal in step 1345, the controller waits a predetermined amount of time at step 1350, and then obtains/receives actual temperature data of the room at step 1355. The waiting period may be any desired amount of time, including, but not limited to, e.g., 30 seconds, 1 minute, 3 minutes, etc. The temperature data of step 1355 may be obtained/received in a manner similar to step 1305.

At step 1360, the controller determines whether the change(s) in fluid source(s) operating state(s) produced the desired result, for example, by comparing temperature data from step 1355 to at least one of thresholds (e.g., step 1310) and desired temperature changes (e.g., step 1330). If the determination at step 1360 is positive, then the process ends or returns to step 1305 for a subsequent iteration.

However, if the determination at step 1360 is negative (e.g., the change(s) in fluid source(s) operating state(s) did not produce the desired result), or if the determination at step 1340 is negative (e.g., it is predicted that change(s) in fluid source(s) operating state(s) will not achieve the desired result), then at step 1365 the controller causes a change in configuration of the duct system. Step 1365 may be performed, for example, in a manner similar to a combination of steps 1225 and 1230 described above with respect to FIG. 12, in which the controller generates and transmits actuation signals for appropriate controllable components based upon input data and any other appropriate data. In this manner, targeted air delivery can be provide to a room (e.g., data center) based upon data associated with the room and, optionally, based upon predetermined rules for configuring the duct system.

EXAMPLES

Figure 14:
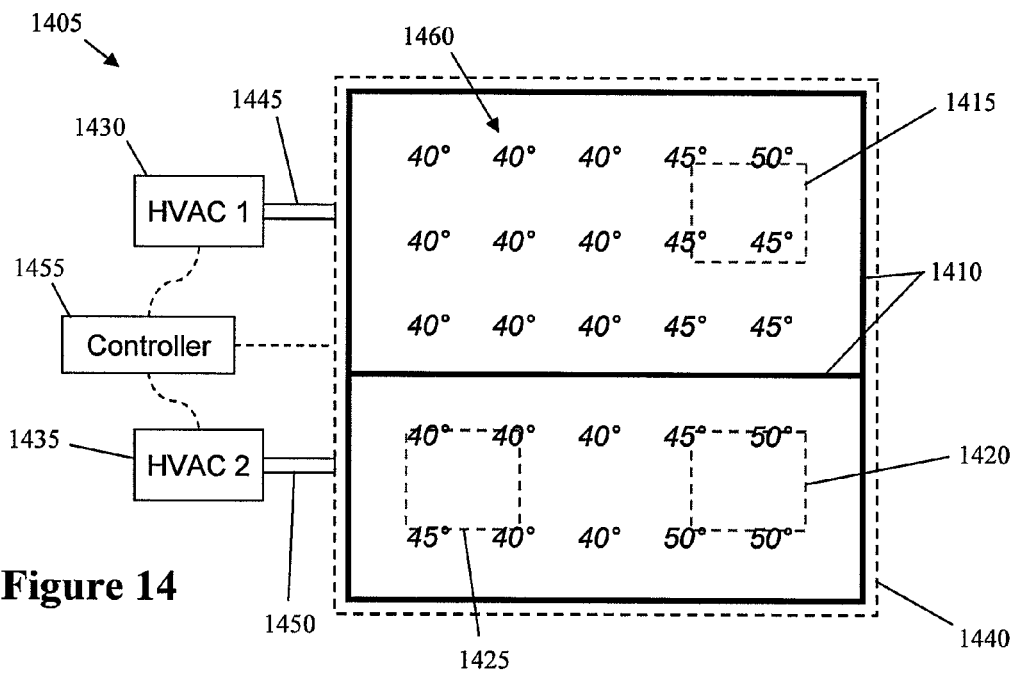
FIGS. 14-18 show exemplary modes of operation according to aspects of the invention.

FIGS. 14-18 show a series of exemplary modes of operation according to aspects of the invention. FIG. 14 shows a top down view of a room 1405 (e.g., data center) having walls or partitions 1410. Within the confines of the room 1405 is IT equipment, e.g., a first server system 1415, second server system 1420, and disk system 1425. Associated with the room 1405 are first fluid source 1430 and second fluid source 1435 (e.g., HVAC units capable of providing heating or cooling air via fans). The first and second fluid sources 1430, 1435 are operatively connected to a duct system 1440, which may be, for example, a configurable dynamic duct system as described with respect to FIGS. 1-9.

The duct system 1440 is shown in dashed line, but is understood to comprise a portion or substantially all of the ceiling of room 1405, such that targeted air delivery may be provide from the fluid sources 1430, 1435 to specific areas of the room 1405 via the duct system 1440. Static ducting 1445, 1450 connects the respective fluid sources 1430, 1435 to the duct system 1440.

Still referring to FIG. 14, controller 1455 is operatively connected to the respective fluid sources 1430, 1435 and the duct system 1440. The controller 1455 may be similar to controller 1105 described above. Moreover, a temperature distribution 1460 of actual temperatures in the room 1405 is shown. The temperature distribution 1460 may be obtained in any suitable manner, such as for example, using array of temperature sensors throughout the room 1405.

Figure 15:
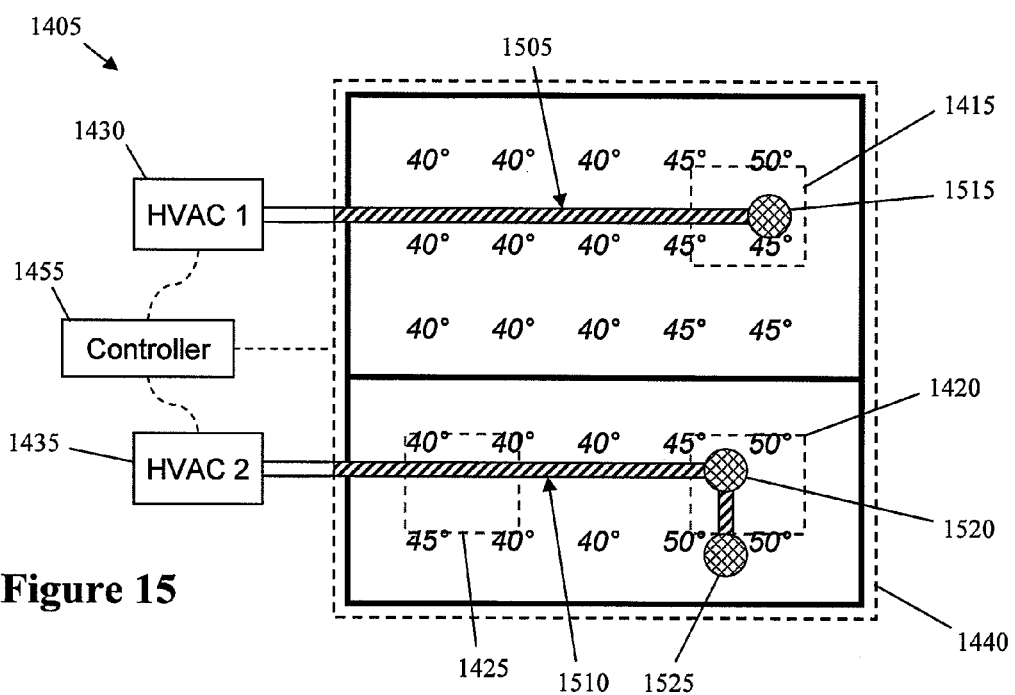

As seen from the temperature distribution 1460, operation of the first and second server systems 1415, 1420 has caused localized hot spots in the room. FIG. 15 depicts where, based upon the sensed temperature distribution 1460 (and any other suitable input data, such as that described above with respect to FIGS. 11-13), the controller 1455 causes the duct system 1440 to dynamically configure two ducts 1505, 1510 to deliver cooling air to the room 1405. Moreover, the controller causes vents 1515, 1520, and 1525 to open such that air can be conveyed from the first and second ducts 1505, 1510 into the targeted areas of the room. In this manner, localized cooling of specific areas of the room is provided.

Figure 16:
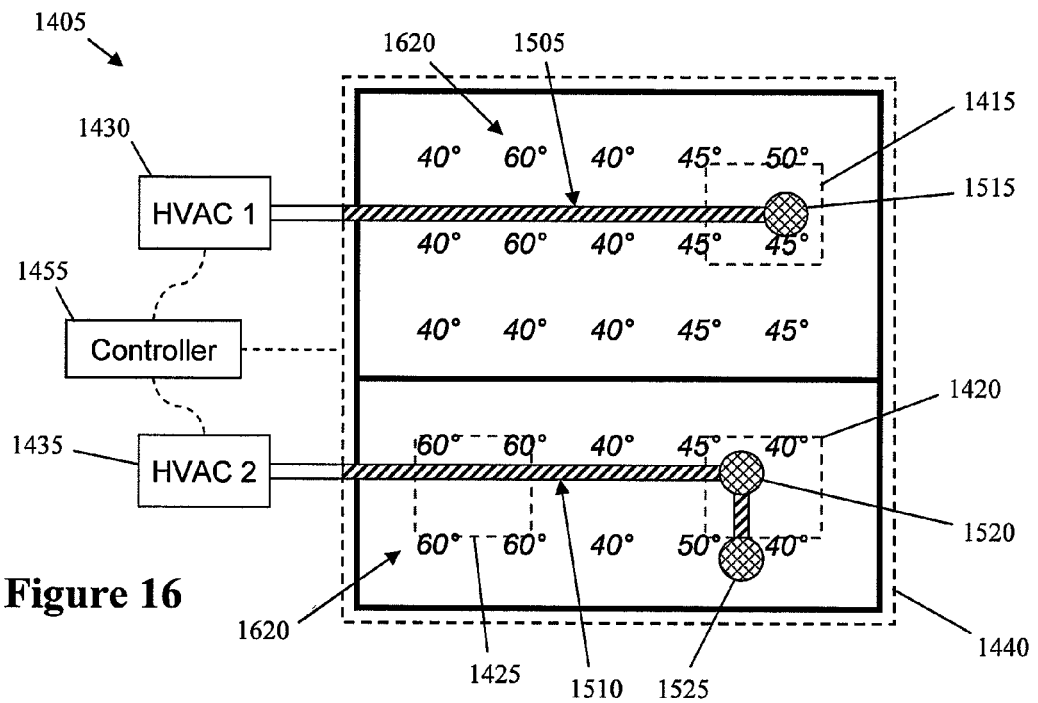

FIG. 16 depicts the situation where the disk system 1425 has come online and begun generating heat, such that the temperature in the vicinity of the disk system is at about 60° F. This results in a new temperature distribution 1620, different from that shown in FIGS. 14 and 15. Moreover, the new temperature distribution shows the effect (e.g., decreased temperature) of the cooling around second server system 1420.

Figure 17:
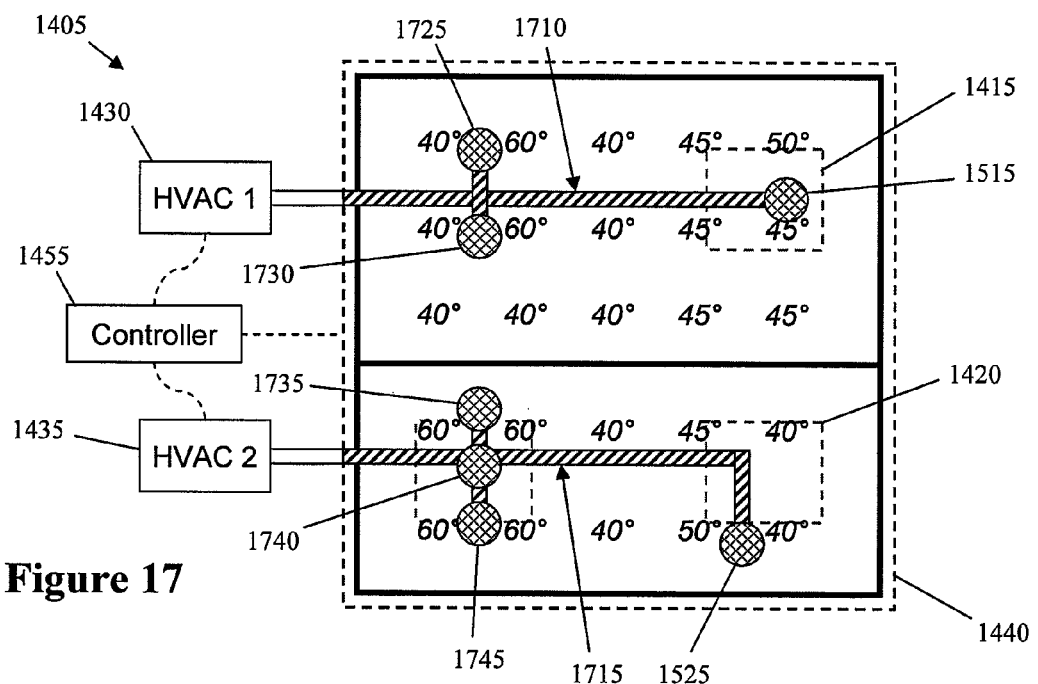

FIG. 17 depicts where, based upon the temperature distribution 1620 (and any other suitable input data, such as that described above with respect to FIGS. 11-13), the controller 1455 causes the duct system 1440 to dynamically re-configure and create two new ducts 1710, 1715. As can be seen in FIG. 17, the two new ducts include modification of the previous ducts (1505, 1510) and also newly created ducts portions. Moreover, the controller causes vents 1725, 1730, 1735, 1740, and 1745 to open such that air can be conveyed from the new ducts 1710, 1715 into the targeted areas of the room 1405. Vents 1515 and 1525 are still in the open state, delivering cooling air to other areas of the room 1405.

Figure 18:
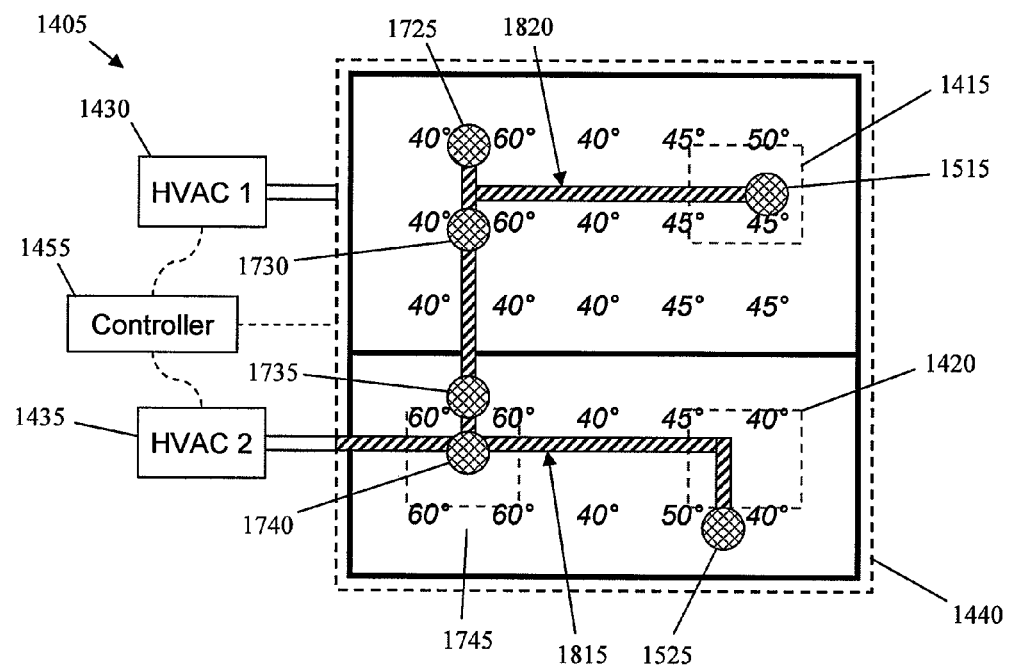

FIG. 18 depicts a situation where the first HVAC unit 1430 from FIG. 17 goes offline (e.g., for planned maintenance, unexpected shut-down, etc.). The controller 1455 has again re-arranged the duct system 1440 to create a single new duct with multiple branches 1815, 1820 to provide cooling air to areas of the room previously served by two fluid sources in FIG. 17. Vents 1515, 1525, 1725, 1730, 1735, and 1740 are still open. However, the controller has caused vent 1745 to close, to ensure adequate air flow to the second branch 1820. Additionally, the controller may increase the fan speed of first fluid source 1435 to provide more cooling air to the duct system 1440. Accordingly, FIGS. 14-18 demonstrate how aspects of the invention are utilized to dynamically change the configuration of a duct system to provide targeted air delivery to specific areas of a room based upon data associated with the room (and other data).

In embodiments, the room comprises a data center, the localized area comprises a hot spot, and the fluid comprises cold air for cooling the localized area. However, the invention is not limited to use with data centers, but rather can be used to provide localized fluid flow (e.g., air flow) into any desired area. For example, implementations of the invention could be used to provide localized air conditioning and/or heating to residential homes, conference centers, hotels, office buildings, stables, etc.

In embodiments, the invention provides a business method that performs the steps of the invention on a subscription, advertising, and/or fee basis. That is, a service provider, such as a Solution Integrator or providing entity, could offer to perform the processes described herein. In this case, the service provider can create, maintain, deploy, support, etc., a computer infrastructure that performs the process steps of the invention for one or more customers. In return, the service provider can receive payment from the customer(s) under a subscription and/or fee agreement and/or the service provider can receive payment from the sale of advertising content to one or more third parties.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
   receiving or obtaining input data;
   generating at least one actuation signal to change a flow configuration of a re-configurable duct system based upon the input data; and
   transmitting the at least one actuation signal,
   wherein the at least one actuation signal comprises: a flow path actuation signal that causes movement of at least one flow diverting part within the duct system to modify an existing duct or create a new duct in the duct system; and a vent actuation signal to open, close, or adjust a vent.

2. The method of claim 1, wherein the input data comprises at least one of:
   actual temperature distribution data of a room;
   predicted heat generation data in the room;
   duct system data;
   fluid source data;
   price data; and
   temperature threshold data.

3. The method of claim 1, wherein the duct system comprises at least a portion of a ceiling, floor, or wall of a room.

4. The method of claim 3, wherein the room comprises a data center and the duct system delivers cooling air to the data center.

5. The method of claim 3, wherein:
the duct system comprises a plurality of tiles;
each one of the plurality of tiles comprises: a duct; a port connected to the duct; a first valve associated with the duct and configured to control fluid flow within the duct; and a second valve associated with the port and configured to selectively place the duct in fluid communication with the room; and
the respective ducts of adjacent ones of the plurality tiles are connected in fluid communication with one another.

6. The method of claim 1, wherein the generating is additionally based on at least one of:
a cost minimization function;
a physical change minimization function;
amount of heat transfer of air traveling within the duct system; and
a shortest path between an air source and an air delivery location.

7. The method of claim 1, wherein the receiving or obtaining, the generating, and the transmitting are performed by a controller.

8. The method of claim 1, wherein at least one of the receiving, the generating, and the transmitting is performed by a service provider under a subscription and/or fee agreement.

9. The method of claim 1, wherein the input data comprises predicted heat generation data in a room.

10. The method of claim 1, wherein the duct system comprises:
a first structural member;
a second structural member;
a space between the first structural member and the second structural member; and
a plurality of partitions that are individually moveable into and out of the space.

11. The method of claim 10, wherein the changing the flow configuration comprises moving a first subset of the plurality of partitions into the space and moving a second subset of the plurality of partitions out of the space.

12. The method of claim 1, wherein the input data comprises: actual temperature distribution data of a room; predicted heat generation data in the room; duct system data; fluid source data; price data; and temperature threshold data.

13. A method, comprising:
receiving or obtaining input data comprising at least one of: actual temperature distribution data of a room; predicted heat generation data in the room; duct system data; fluid source data; price data; and temperature threshold data; and
re-configuring a duct system to provide targeted air delivery to a room based on the input data,
wherein the re-configuring comprises at least one of: modifying the shape of an existing duct within the duct system, and creating a new duct within the duct system.

14. The method of claim 13, wherein the re-configuring comprises generating and transmitting actuation signals, based on the input data, to actuate moveable parts of the duct system.

15. The method of claim 13, wherein the re-configuring is additionally based on at least one of:
a cost minimization function;
a physical change minimization function;
amount of heat transfer of air traveling within the duct system; and
a shortest path between an air source and an air delivery location.

16. The method of claim 13, wherein at least one of the receiving and the re-configuring is performed by a service provider under a subscription and/or fee agreement.

17. A method, comprising:
receiving or obtaining first input data;
configuring a dynamically changeable duct system to deliver air to a first area of a room based on the first input data;
receiving or obtaining second input data; and
re-configuring the dynamically changeable duct system to deliver air to a second area of the room based on the second input data,
wherein at least one of the configuring and the re-configuring are additionally based on at least one of:
a cost minimization function;
a physical change minimization function;
amount of heat transfer of air traveling within the duct system; and
a shortest path between an air source and an air delivery location.

18. The method of claim 17, wherein the first and second input data comprise at least one of: actual temperature distribution data of the room; predicted heat generation data in the room; duct system data; fluid source data; price data; and temperature threshold data.

19. The method of claim 17, wherein:
the second area of the room is different than the first area of the room,
the room comprises a data center,
the duct system comprises at least a portion of a ceiling, floor, or wall of the data center, and
the duct system delivers at least one of heating air, cooling air, and ventilation air to the data center.

20. The method of claim 17, wherein the configuring and the re-configuring comprise generating and transmitting actuation signals.

21. The method of claim 17, wherein the re-configuring comprises modifying the shape of an existing duct within the duct system.

22. The method of claim 17, wherein the re-configuring comprises creating a new duct within the duct system.

23. A computing infrastructure comprising a controller structured and arranged to:
receive or obtain first input data;
configure a dynamically changeable duct system to deliver air to a first area of a room based on the first input data;
receive or obtain second input data; and
re-configure the dynamically changeable duct system to deliver air to a second area of the room based on the second input data,
wherein at least one of the configuring and the re-configuring are additionally based on at least one of:
a cost minimization function;
a physical change minimization function;
amount of heat transfer of air traveling within the duct system; and
a shortest path between an air source and an air delivery location.

* * * * *